United States Patent
Gerlach et al.

(10) Patent No.: US 6,683,320 B2
(45) Date of Patent: Jan. 27, 2004

(54) THROUGH-THE-LENS NEUTRALIZATION FOR CHARGED PARTICLE BEAM SYSTEM

(75) Inventors: Robert L. Gerlach, Portland, OR (US); Mark W. Utlaut, Scappoose, OR (US)

(73) Assignee: FEI Company, Hillsboro, OR (US)

( * ) Notice: Subject to any disclaimer, the term of this patent is extended or adjusted under 35 U.S.C. 154(b) by 17 days.

(21) Appl. No.: 09/859,295

(22) Filed: May 16, 2001

(65) Prior Publication Data

US 2002/0134949 A1 Sep. 26, 2002

Related U.S. Application Data

(63) Continuation-in-part of application No. 09/780,876, filed on Feb. 8, 2001.
(60) Provisional application No. 60/205,605, filed on May 18, 2000.

(51) Int. Cl.[7] ............................. H01J 37/26; H01J 37/12
(52) U.S. Cl. ............................. 250/494.1; 250/492.2; 250/492.21; 250/492.3; 250/396 R; 250/397; 250/306; 250/307; 250/309; 250/310
(58) Field of Search ...................... 250/306, 307, 250/309, 310, 492.2, 492.21, 492.3, 494.1, 396 R, 397

(56) References Cited

U.S. PATENT DOCUMENTS

| | | | |
|---|---|---|---|
| 4,126,781 A | 11/1978 | Siegel | 250/281 |
| 4,417,203 A * | 11/1983 | Pfeiffer et al. | 324/501 |
| 4,443,278 A * | 4/1984 | Zingher | 156/64 |
| 4,578,279 A * | 3/1986 | Zingher | 427/10 |
| 4,639,301 A | 1/1987 | Doherty et al. | 204/192.31 |
| 4,748,325 A | 5/1988 | Slodzian | 250/309 |
| 4,818,872 A | 4/1989 | Parker et al. | 250/309 |
| 4,639,301 A | 6/1989 | Doherty et al. | 204/192.31 |
| 5,502,306 A | 3/1996 | Meisburger et al. | 250/310 |
| 5,834,770 A | 11/1998 | Holkeboer et al. | 250/281 |
| 4,639,301 A | 5/1999 | Doherty et al. | 204/192.31 |
| 6,218,664 B1 | 4/2001 | Krans et al. | 250/310 |
| 6,232,787 B1 * | 5/2001 | Lo et al. | 324/751 |
| 2002/0130260 A1 * | 9/2002 | McCord et al. | 250/306 |
| 2002/0134949 A1 * | 9/2002 | Gerlach et al. | 250/492.21 |
| 2003/0047691 A1 * | 3/2003 | Musil et al. | 250/492.2 |

* cited by examiner

Primary Examiner—John R. Lee
Assistant Examiner—Bernard Souw
(74) Attorney, Agent, or Firm—Michael O. Scheinberg

(57) ABSTRACT

An electron source provides electrons that are directed through the final lens of an ion optical column to neutralize at least a portion of the accumulated charge on a sample. The invention can optionally be combined with collection of secondary electrons through the final ion lens. A deflector directs the neutralizing electrons onto the ion beam optical axis and deflects the secondary electrons away from the optical axis for detection. For imaging, a high-pass energy filter separates secondary electrons generated from the neutralizing electron beam from secondary electrons generated by the ion beam.

22 Claims, 9 Drawing Sheets

THROUGH-THE-LENS NEUTRALIZATION FOR CHARGED PARTICLE BEAM SYSTEM

The present application claims priority from U.S. Provisional Patent Application No. 60/205,605, filed May 18, 2000 and is a continuation-in-part of U.S. patent application Ser. No. 09/780,876, filed Feb. 8, 2001.

TECHNICAL FIELD OF THE INVENTION

The present invention relates to controlling charge accumulation on samples in charged particle beams systems and, in particular, to the neutralization of positive charge accumulation on samples in Focused Ion Beam (FIB) systems.

BACKGROUND OF THE INVENTION

Insulating samples in charged particle beam systems tend to accumulate electrical charge because the charged particle beam brings charges to the sample and ejects charged secondary particles from the sample. The charge accumulating on an insulating sample can adversely affect the focusing and positioning of the charged particle beam and can inhibit the emission of secondary particles used to form an image of the sample or to analyze its composition. In a typical focused ion beam system, positively charged gallium ions impact the sample, knocking out secondary electrons and both positive and negative secondary ions. The net flow of charges typically leaves the sample positively charged.

Various methods have been used to eliminate unwanted charge accumulation. One method is to provide a conductive layer to drain the charge from an otherwise insulating sample. The conductive layer can be formed, for example, by depositing a thin film of a conductor such as gold or by implanting ions, such as gallium ions, into the sample.

Another method of eliminating accumulated charge is to neutralize the charge by delivering opposite charges to the sample. For example, an accumulation of positive charges can be neutralized by directing a beam of low energy electrons from an electron flood gun toward the sample. Such a neutralization system used with a focused ion beam (FIB) system is described, for example, in U.S. Pat. No. 4,639,301 for "Focused Ion Beam Processing" to Doherty et al., which is assigned to the assignee of the present application. Charge neutralization flood guns in FIB systems typically require an unobstructed line of sight from the flood gun to the sample surface and are traditionally mounted to the side of and above the sample. To provide an unobstructed line of sight from the electron gun to the sample, the final lens of the FIB column is spaced away from the sample. Increasing the distance between the sample and the final lens, referred to as the "working distance," reduces the ability of the ion optical column to focus the ions, thereby decreasing the system resolution.

Alternatively, an electron flood gun can be mounted below the final lens and substantially perpendicular to the primary ion beam. A negative electrical potential below the lens, is then required to deflect the neutralizing electrons towards the sample. This scheme also requires substantial spacing between the lens and sample resolution. Secondary particle detectors, which are routinely used with focused ion beam systems and which need to be close to the sample to collect a large portion of the secondary particles, also necessitate spacing the ion beam lens away from the sample, thereby increasing the working distance.

U.S. Pat. No. 4,818,872 to Parker et al. describes a system in which neutralizing electronsare directed from a flood gun through a deflector positioned below the final ion lens and then to a sample. The deflector requires that the final lens be positioned away from the sample, thereby increasing the working distance and reducing resolution.

Another problem with the electron flood gun described in the Doherty et al. patent is that operation of the flood gun interferes with the use of secondary electrons for imaging. The Doherty et al. patent describes alternating between the use of a neutralizing flood gun and secondary electron imaging because secondary electron imaging is apparently not practical when neutralizing electrons are being directed to the sample. When using electrons from a flood gun for neutralization, it is known to use secondary ions, instead of secondary electrons, to form an image of a sample. The signal-to-noise ratio for an image produced from secondary ions, however, is typically lower than the ratio for an image produced from secondary electrons because there are fewer secondary ions than secondary electrons. In today's microfabrication environment, engineers and scientists need a good signal-to-noise ratio to create high resolution images of extremely small features.

Another method of charge neutralization is described in U.S. Pat. No. 4,748,325 to Slodzian for a "Method and Device to Discharge Samples of Insulating Material During Ion Analysis." In the method described by Slodzian, a primary beam of ions sputters secondary ions that are accelerated towards a detector by an acceleration electrode. Some of the secondary ions strike the acceleration electrode and cause electrons to be ejected. The electrons are then directed back to the ion beam impact area of the sample by a charged, conductive film surrounding the ion beam impact area. Deposition of the conductive film and conductors to charge requires an extra processing step and can destroy the sample.

Thus, there remains a need for a charge neutralization technique that does not involve a deposition step, which takes time and alters the sample, does not require increased ion lens working distance, and allows for secondary electron imaging.

SUMMARY OF THE INVENTION

An object of the invention is to neutralize charges on a sample upon which a charged particle beam is directed.

The present invention comprises an electron source that provides electrons that are directed through the final lens of the ion optical column to neutralize at least a portion of the accumulated charge on the sample. The invention can optionally be combined with collection of secondary electrons through the final ion lens.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1:
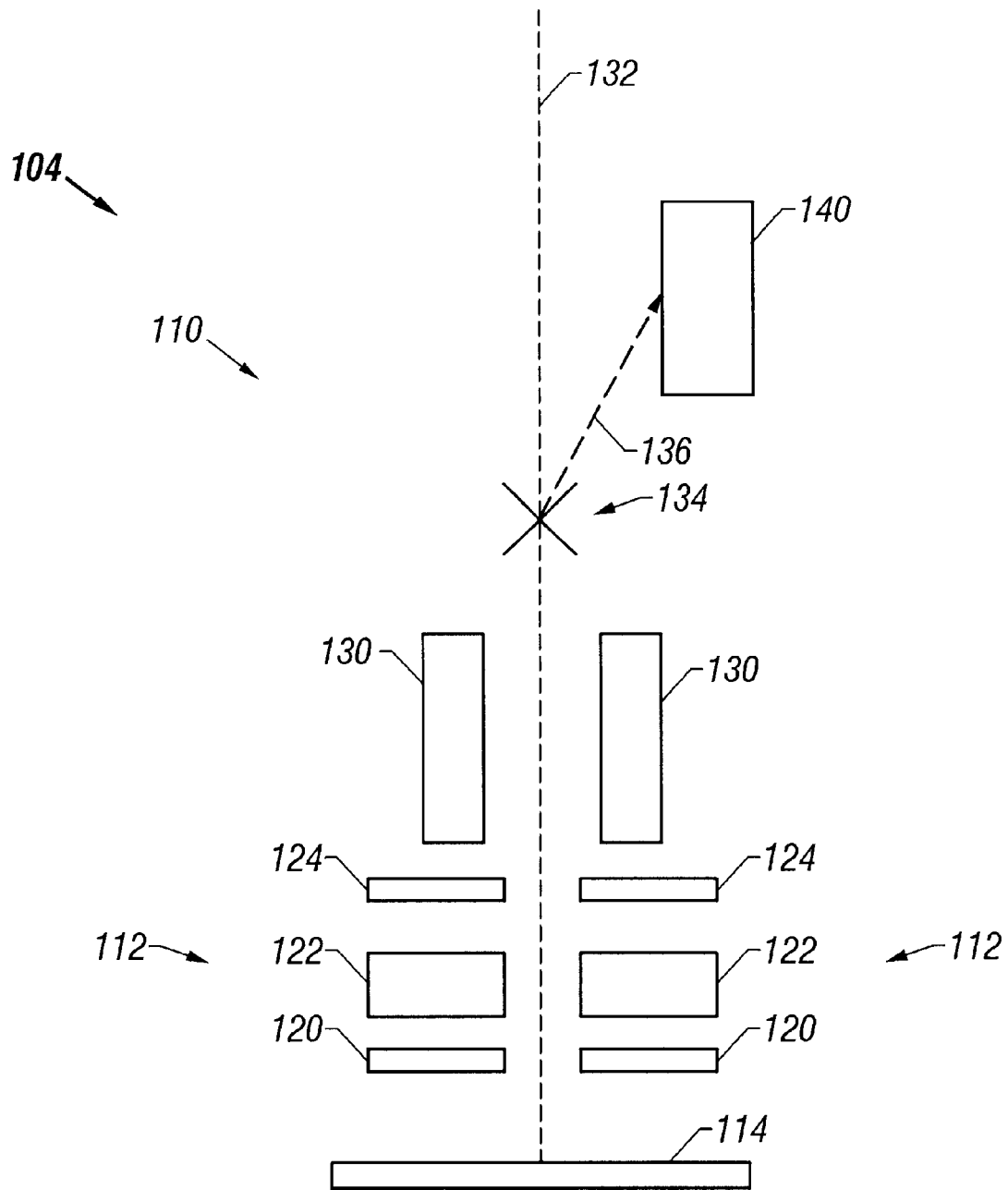
FIG. 1 is a schematic cross-sectional view of a FIB column that collects secondary electrons through its final ion lens.

In a preferred embodiment, neutralizing particles are directed through the final, primary beam focusing lens to a sample in a charged particle beam system. The final primary beam focusing lens is typically an axial focusing lens and typically operates at a voltage that is greater than about one half of the beam energy in electron volts. The source of the neutralizing particles is preferably positioned off the optical axis of the charged particle beam system, and the neutralizing particles are redirected after leaving their source so that they travel essentially along the optical axis through the final primary beam lens before reaching the sample. The neutralizing particles may travel through other optical elements of the charged particle beam system besides the final lens.

A preferred embodiment combines through-the-lens neutralization with through-the-lens collection of secondary particles for imaging or analysis. Secondary particles generated by impact of the primary beam can be used to form an image of the sample using well known techniques, such as those used in scanning electron microscopes. To form an image, a primary beam scans the sample, and the intensity of each point on the display is controlled to correspond to the number of secondary electrons ejected by the primary beam from each point being scanned. Because the primary beam can be focused to a very small spot, the resolution of the image can be quite high.

The neutralizing particles bombarding the sample can also cause the ejection of secondary particles. Because the neutralizing particles are typically not focused as tightly as the primary beam, secondary particles ejected by the neutralizing particles come from a much wider area than do secondary particles ejected by the primary beam. Thus detecting secondary particles ejected by the neutralizing electrons along with secondary electrons ejected by the ion beam degrades the resolution of secondary particle images.

The present invention allows for accurate charge control or neutralization that can optionally be performed simultaneously with secondary particle imaging. The present invention provides a way to discriminate between secondary particles generated by the neutralizing particle beam and secondary particles generated by the primary beam. By transmitting neutralizing electrons and collecting secondary particles through the final primary beam lens, the final primary beam lens can be positioned closer to the sample to provide a short working distance and correspondingly higher resolution.

A deflector, which directs neutralizing particles onto the optical axis of the primary column and directs secondary particles away from the primary optical axis for detection, facilitates combining collection of secondary particles through-the-lens with injecting neutralizing charge down the primary column through the lens for sample neutralization. A discriminator, such as a high pass energy filter, allows the system to differentiate between secondary particles emitted as a result of the impact of primary beams on the sample and secondary particles emitted as a result of the impact of the neutralizing charges on the sample. Secondary particle detection and charge neutralization can occur concurrently in some implementations.

In a preferred embodiment, the primary beam comprises ions, the neutralizing particles comprise electrons, and the secondary particles that are collected comprise electrons. By allowing the use of secondary electron imaging during charge neutralization, the invention is expected to provide improved signal-to-noise ratio in imaging compared to the prior art, which uses secondary ions to image while neutralizing.

In some embodiments of the invention, neutralizing particles can reach the sample only if the sample becomes charged above a threshold potential, for example, −100 V. Thus, a sample can be maintained at a specified potential, and the sample charge will not be unintentionally altered by an excess of neutralizing particles.

Through-the-lens electron detection in an electron beam column is known and described, for example, in U.S. Pat. No. 6,218,664 of Krans et al. In the Krans et al. design, the lower lens center element and upper element (and optionally the lower element) are biased to positive potentials to draw the electrons from the sample up and above the lens. The electrons are then detected by a channel plate electron multiplier, which is oriented roughly perpendicularly to the ion column axis and which has a hole in its center to pass the primary electron beam.

The charged particle optics in a FIB column is significantly different from that of the low voltage scanning electron microscope column described by Krans et al. A typical FIB column operates at a beam voltage of about 30 kV, and the final lens is an einzel lens—the center element is at a high positive potential and the upper and lower elements are typically maintained at ground potential. Thus, the technique described by Krans et al. for an electron beam system requires extensive changes to be implemented into an ion beam system.

Applicants realized that the mass-to-charge ratio for ions employed in FIB systems is orders of magnitude higher than for electrons, and, in addition, the ion energies are much higher than the electron energies. Thus, a simple magnetic field transverse to the optical axis of the primary beam column can be employed to deflect the neutralizing electrons onto or off of the optical axis with minimal disturbance to the primary ion beam. For example, applicants have used gallium ions with a 30 kV beam voltage and electrons extracted upwards from the sample through the final lens using 2000 V.

Applicants show below how a magnet deflector can deflect the neutralizing electrons and the secondary electrons for imaging while having minimal impact on the primary ion beam trajectory. A magnetic field tends to cause a charged particle to move in a circle. The power of the deflector magnet to alter the direction of a charged particles can be characterized by the radius of the circle that the particle moves in, which is known as the cyclotron radius, R, and is described by the following equation:

$$R = mv/Be \qquad (1)$$

where m is the mass, v is the velocity of the charged particle, B is the magnetic field strength, and e is the electron charge. Substituting the electron kinetic energy, E, and mass into Equation 1 gives:

$$R = (2Em)^{1/2}/Be \qquad (2)$$

For electrons, it can be shown that B multiplied by R(gauss-cm)=3.37 $E^{1/2}$ (where E is in eV). Therefore, if we use R=5 mm and E=2000 eV for the secondary electrons accelerated upward beyond the final lens, then B=301.4 gauss.

A bending magnet of approximately 300 gauss has minimal disturbance of the primary ion beam. Fortunately, gallium primary ions have the same size charge as the electrons, but each gallium ion has a mass about 160,000 times the mass of an electron. Furthermore, the electron energies are typically about 15 times less than the ion energy. Using Equation 2, we see that the cyclotron radius for the primary ions is typically about 7.75 meters, which is about 1550 times larger than the electron cyclotron radius. Hence the disturbance to the primary ion beam path is small. In fact the path deviation is only about 1.2 milli-radians, which deviation can be very easily corrected with known beam steering techniques. It can also be shown that the aberration introduced into the primary ion beam by the magnetic field is predominately chromatic and is negligible in most applications.

Figure 3:
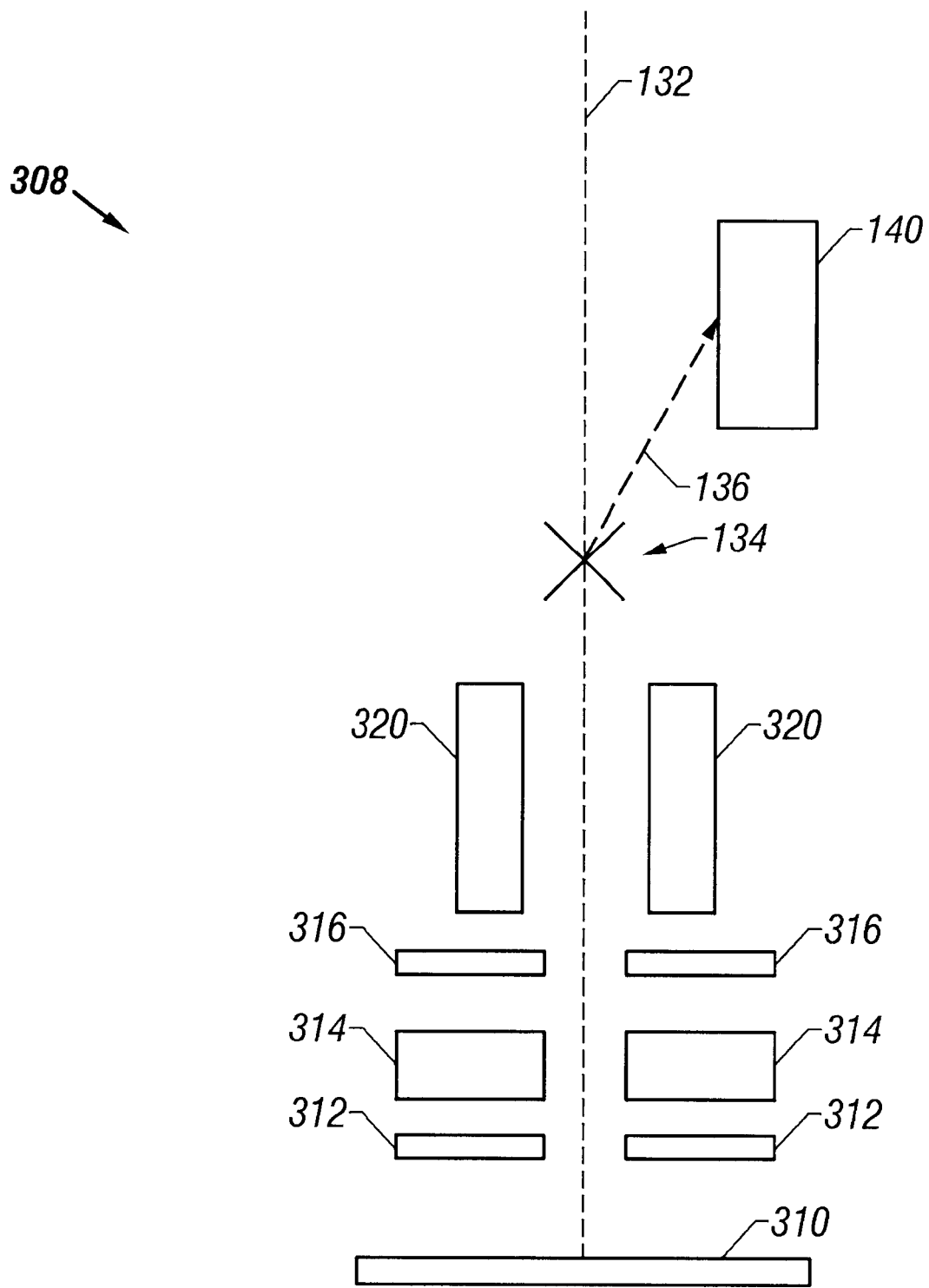
FIG. 3 is a schematic cross-sectional view of another FIB column that collects secondary electrons through its final ion lens.

FIGS. 1 and 3 show the systems described in U.S. patent application Ser. No. 09/780,876 that provide for collecting secondary particles through the final lens of an ion column. FIG. 1 shows a though-the-lens detection system 104 for an ion column 110 that uses two ion lens: a first lens (not shown) positioned above the elements shown in FIG. 1 and a second lens 112 positioned near a sample 114. Second lens 112 includes three lens elements: a lower lens element 120 positioned closest to sample 114, a middle lens element 122, and an upper lens element 124 positioned furthest from sample 114. An ion beam deflector 130, typically comprising electrostatic deflector plates, controls the deflection of a beam of primary ions 132.

Low energy secondary electrons having energies of about 5 eV, are ejected from the sample and accelerated up through second lens 112 by an electrical potential gradient as described below. A magnetic deflector 134 deflects secondary electrons 136 off the path of primary ions 132 while allowing the high mass-to-charge ratio primary ions 132 to pass nearly straight through column 110. Alternatively, a Wein filter or an electrostatic deflection device could be used to deflect secondary electrons 136. An electron detector 140, such as a scintillator, continuous dynode multiplier, or channel plate, is then placed to the side for collecting the electrons and amplifying the electron signal for processing by standard FIB video electronics.

In the embodiment of FIG. 1, sample 114 and lower lens element 120 are maintained at approximately ground potential. Lens element 122 is maintained at approximately +20,000 V. Optical elements above lower lens element 122 are biased to between about +500 V and +5000 V with respect to ground to continue the secondary electron velocities upward beyond lens 112. For example, in one embodiment, upper lens element 124, electrostatic deflector plates 130, and deflector 134 are biased to preferably +2000 volts to continue this upward velocity of secondary electrons 136 towards electron detector 124, the input of which is similarly biased.

Figure 2:
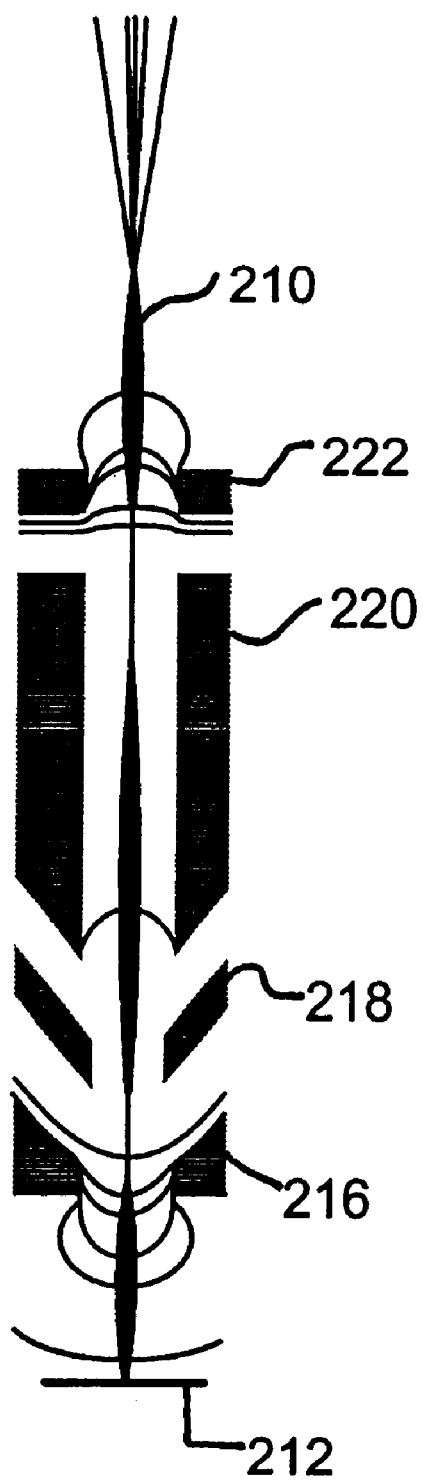
FIG. 2 shows a computer simulation of secondary electron trajectories.

The secondary electrons having energies of approximately 5 eV are accelerated rapidly by the high potential on lens element 122. These electrons are decelerated as they pass through lens element 124 and the deflection electrodes 130, but the secondary electrons still maintain trajectories that are relatively close to the column axis. Magnetic deflector 134 or another type of separation device then directs the electrons toward the detector 140. FIG. 2 shows a computer simulation of the collection of secondary electrons 210 traveling from a sample 212 back through the optical elements 216, 218, 220, and 222, with element 216 having a potential relative to sample 212.

The apparatus in FIG. 1 may also be used to detect secondary ions emitted from the sample. To collect secondary positive ions, the middle lens element 122 is biased to a negative potential. Lens 112 then functions as an acceleration lens for the positive ions. Skilled persons will recognize that significantly changing the voltages and therefore, the focusing properties of lens 112, may require compensating changes to the properties of the first ion lens. In addition, electrostatic deflector 130, deflector 134, and the input of particle detector 140 are negatively biased. A quadrupole or other mass spectrometer can also be placed in the position of detector 140 to perform Secondary Ion Mass Spectrometry. Appropriate biasing of the column and detector can be employed to detect either positive or negative ions. Skilled persons can readily determine suitable biasing by using the examples provided herein as guidance and varying the biases while observing the number of particles detected.

FIG. 3 shows another ion column 308 that provides through-the-lens collection of secondary charged particles. The structure of the ion columns shown in FIGS. 1 and 3 are identical, but the ion columns of FIG. 1 and FIG. 3 operate with different voltages applied to the column elements. In implementation, the different applied voltages may require different structures to provide appropriate voltage isolation. Like column 110 for FIG. 1, column 308 includes a sample 310 and a lower final lens element 312, but in column 308, both are biased to about −2000 V to propel the electrons back through the lens. If it is desired to collect secondary positive ions instead of electrons, sample 310 and lower final lens element 312 can be biased to about +2000 V.

Center lens element 314 is biased to approximately +20,000 V. Upper lens element 316, electrostatic deflector elements 320, and deflector 314 need not be electrically biased and are maintained at approximately ground potential, which simplifies the electronic circuitry and the construction of the optical elements. If, however, the ion beam systems include other devices, such as gas injectors, these devices must also be biased to the same potential as the sample.

Figure 4:
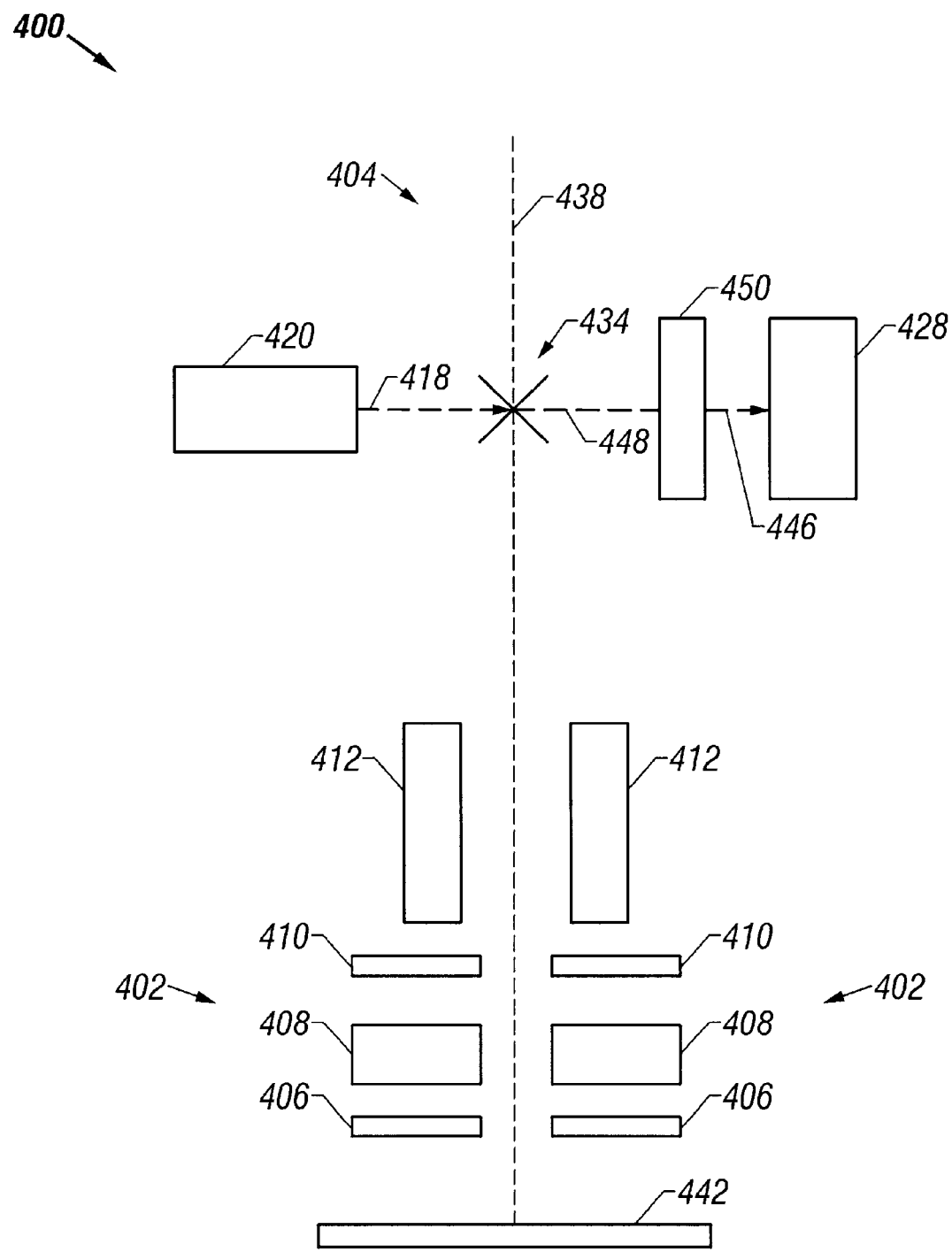
FIG. 4 is a schematic cross-sectional view of a FIB column that delivers neutralizing electrons through its final lens and can also collect secondary electrons through its final lens.

FIG. 4 shows a system 400 similar to that of FIG. 1, but the FIG. 4 system provides for charge neutralization by directing neutralizing electrons through a final, high voltage, ion beam axial focusing lens 402 of an ion optical column 404. Final ion lens 402 includes three elements: a lower lens element 406, preferably maintained at approximately ground potential; a middle lens element 408, preferably maintained at about +20,000 V; and an upper lens element 410, preferably maintained at about between +500 V and +5,000 V, most preferably at about +2,000 V. Electrostatic deflectors 412 are preferably maintained at the same potential as lens upper element 410, that is, most preferably at about +2,000 V.

A source of neutralizing electrons 418, such as an electron flood gun 420, is positioned opposite a secondary electron detector 428. The flood gun is preferably maintained at a potential of about −2000 V and emits electrons with kinetic energy of about 2020 eV towards the deflector. The neutralizing electrons 418 from flood gun 420 are deflected by a magnetic deflector 434, which is maintained at a potential of approximately +2,000 V, towards a primary ion beam axis 438 and down towards a sample 442, which is preferably maintained at approximately ground potential.

The impact of the ions in the primary ion beam and the neutralizing electrons both cause the ejection of secondary electrons. Secondary electrons ejected by the impact on sample 442 of ions in the primary beam are referred to as ion-beam-generated secondary electrons 446. Secondary electrons ejected by the impact of neutralizing electrons ions on sample 442 are referred to as ion-beam-generated secondary electrons 448.

The difference in electrical potential between the electron source in the electron flood gun 420 and sample 442 determines the energy that the neutralizing electrons 418 will have upon reaching the sample 442. For example, for neutralizing electrons generated from a flood gun source maintained at −20 V with respect to sample 442, the neutralizing electrons will have an energy of 20 eV as they strike the ground potential surface of sample 442. These neutralizing electrons can then generate secondary electrons having a maximum energy of only 20 eV.

The neutralizing-electron-generated secondary electrons 446 will travel back up the optical column 404 along with the ion-beam-generated secondary electrons 448. The neutralizing-electron-generated secondary electrons 448 would interfere with imaging if they were not separated from the ion-beam-generated secondary electrons 446 before detection. Secondary electrons 446 and 448 traveling up the optical column are bent towards secondary electron detector 428 by the magnetic deflector 434. A high pass electron energy filter, such as a retarding field filter 450, is positioned before the electron detector 428 to reject the flood gun-generated electrons 448.

Figure 5:
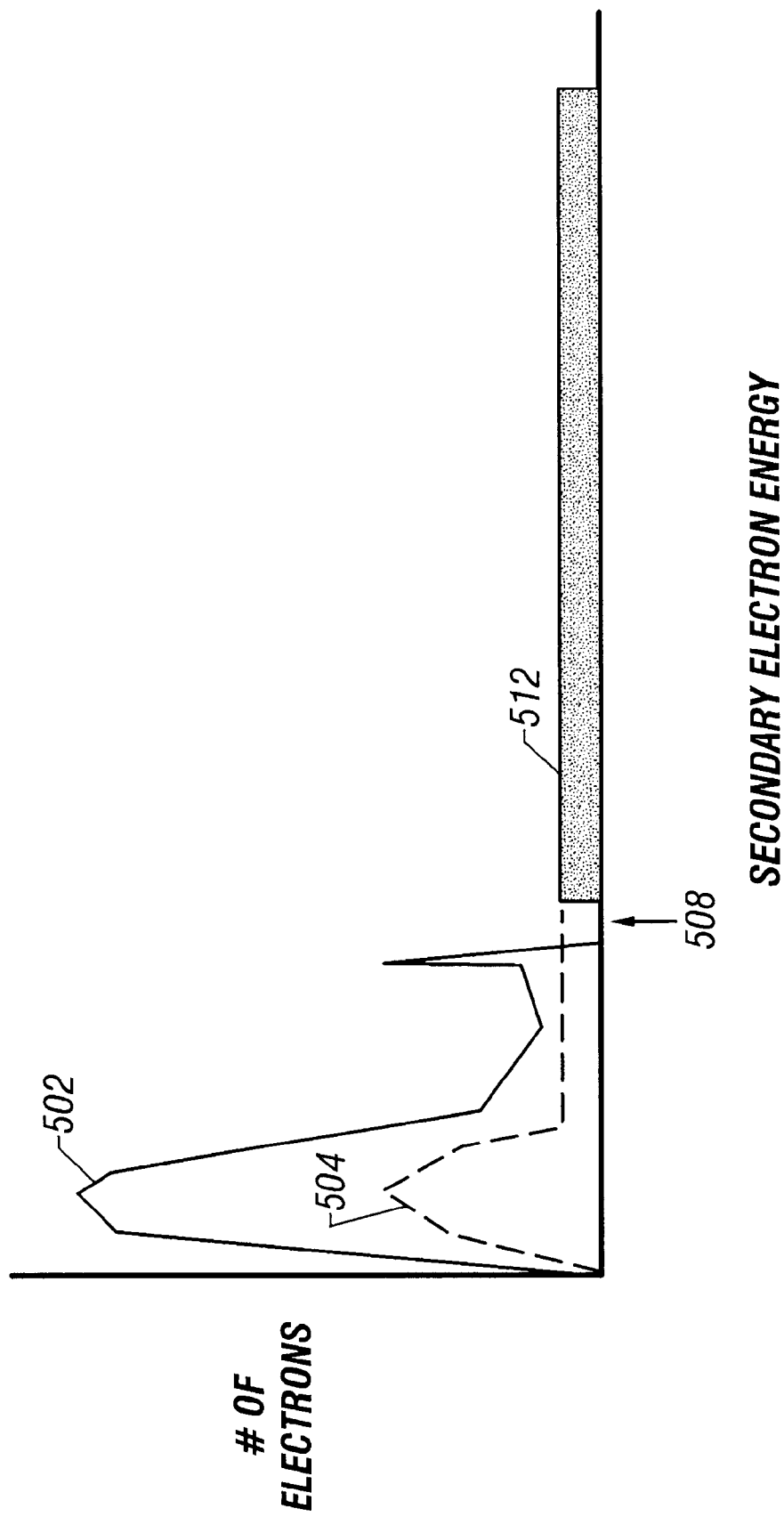
FIG. 5 shows energy distributions of secondary electrons generated by a focused ion beam and by an electron flood gun.

FIG. 5 shows the energy distribution 502 of neutralizing-electron-generated secondary electrons 448 and an energy distribution 504 of ion-beam-generated secondary electrons 446. High pass energy filter 450 is set to pass only secondary electrons having an energy greater than a predetermined cut-off energy. FIG. 5 shows a cut-off voltage 508 selected that is greater than the maximum energy of neutralizing-electron-generated secondary electrons 448, so that only ion-beam-generated secondary electrons 446 have energies sufficiently great to pass the filter. In the example of FIG. 4, using 20 eV neutralizing electrons, a 30 eV limit is used by the filter. The ion-beam-generated secondary electrons 446 that have energies less than 30 eV are lost from the signal along with the neutralizing-electron-generated secondary electrons 448, but the resulting signal is typically larger than the ion beam signal used in the Doherty et al. system for flood gun neutralization work.

Figure 6:
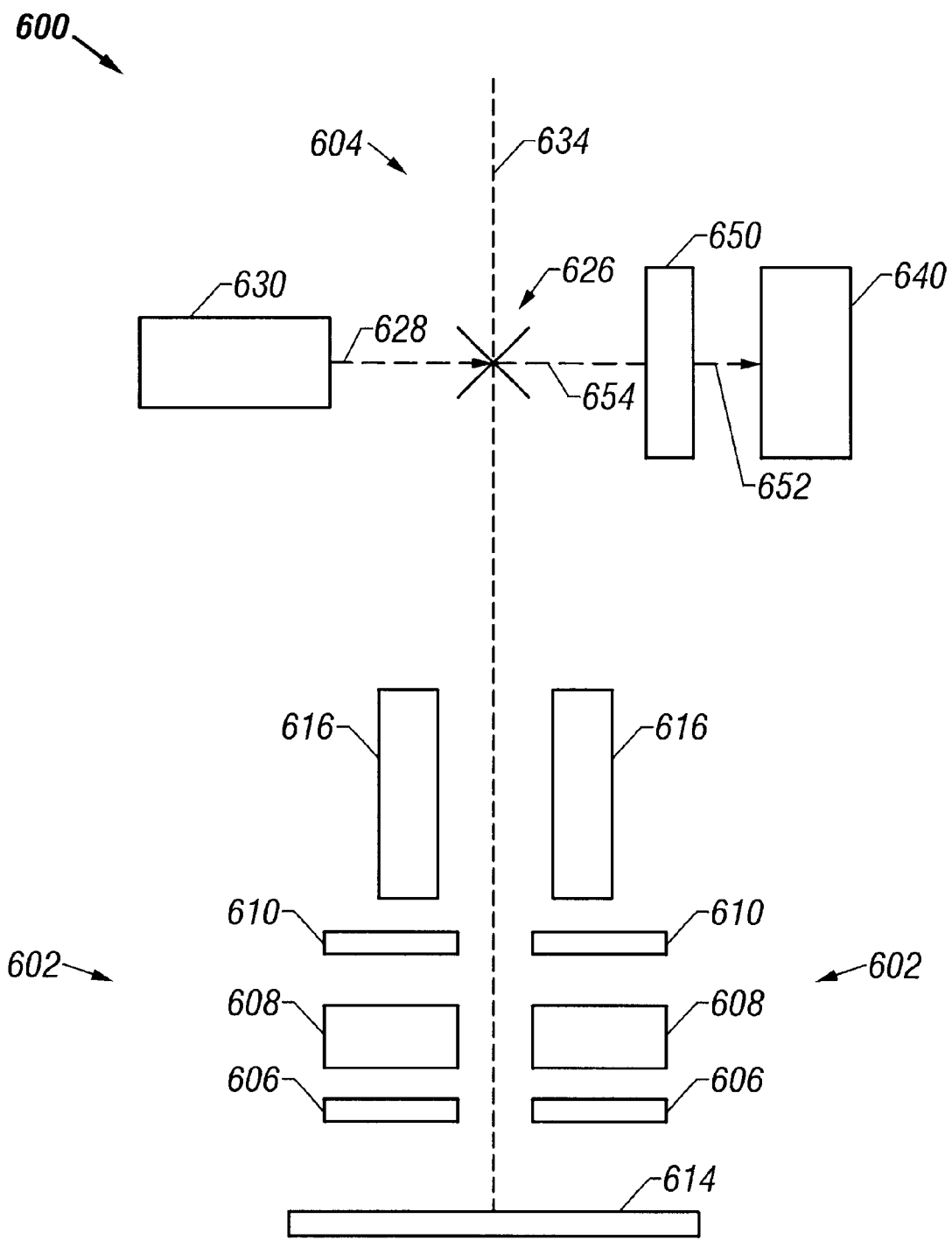
FIG. 6 is a schematic cross-sectional view of another FIB column that delivers neutralizing electrons through its final lens and also collects secondary electrons through its final lens.

FIG. 6 shows another preferred system 600 that provides for charge neutralization by directing neutralizing electrons through a final ion beam lens 602 of an ion optical column 604. The structure shown in FIG. 6 is identical to that shown in FIG. 4, but the elements have different voltages applied. In implementation, the different applied voltages may require different structures to provide appropriate voltage isolation. In the systems of FIG. 4 and FIG. 6, it is necessary to create a potential gradient to propel secondary electrons up through the ion column to a detector. In the system of FIG. 4, the gradient is provided by positively biasing column elements from the upper lens element of the final lens to the electron detector. In the system of FIG. 6, the gradient is provided by negatively biasing the sample and the lower element of the final lens. In the system of FIG. 4, the sample is at ground potential, whereas in the system of FIG. 6, the upper elements are at ground potential.

Final ion lens 602 includes three elements: a lower lens element 606, preferably maintained at between −500 V and −5000V, and most preferably at about −2,000 V; a middle lens element 608, preferably maintained at about +20,000 V; and an upper lens element 610, preferably maintained at approximately ground potential, that is, 0 V. Sample 614 is also maintained at about the same potential as lower lens element 606, that is, most preferably at about −2,000 V. Electrostatic deflectors 616 are preferably maintained at the same potential as upper lens element 610, that is, at about ground potential. An electron deflector, preferably a magnetic deflector 626, is also maintained at approximately ground potential and deflects the neutralizing electrons 628 emitted from a flood gun 630 toward the primary ion beam optical axis 634 and deflects secondary electrons ejected from sample 614 toward a detector 640. Flood gun 630 produces electrons having energies of approximately 2020 eV. A high pass energy filter 650 passes secondary electrons having energy greater than 2030 eV to separate ion-beam-generated secondary electrons 652 from neutralizing-electron-generated secondary electrons 654.

Applying a negative bias to sample 614 and lower final lens element 606 to propel the secondary electrons back up through the column eliminates the requirement to maintain deflector elements 616, upper lens element 610, magnetic deflector 626 at high positive voltages as was necessary in system 400 of FIG. 4. The implementation of system 600 is, therefore, simplified compared to that of system 400. Like the system of FIG. 3, however, system 600 would require that any optional system devices positioned near the sample, for example, a gas injection nozzle (not shown), be biased to the same potential as the sample.

Figure 7A:
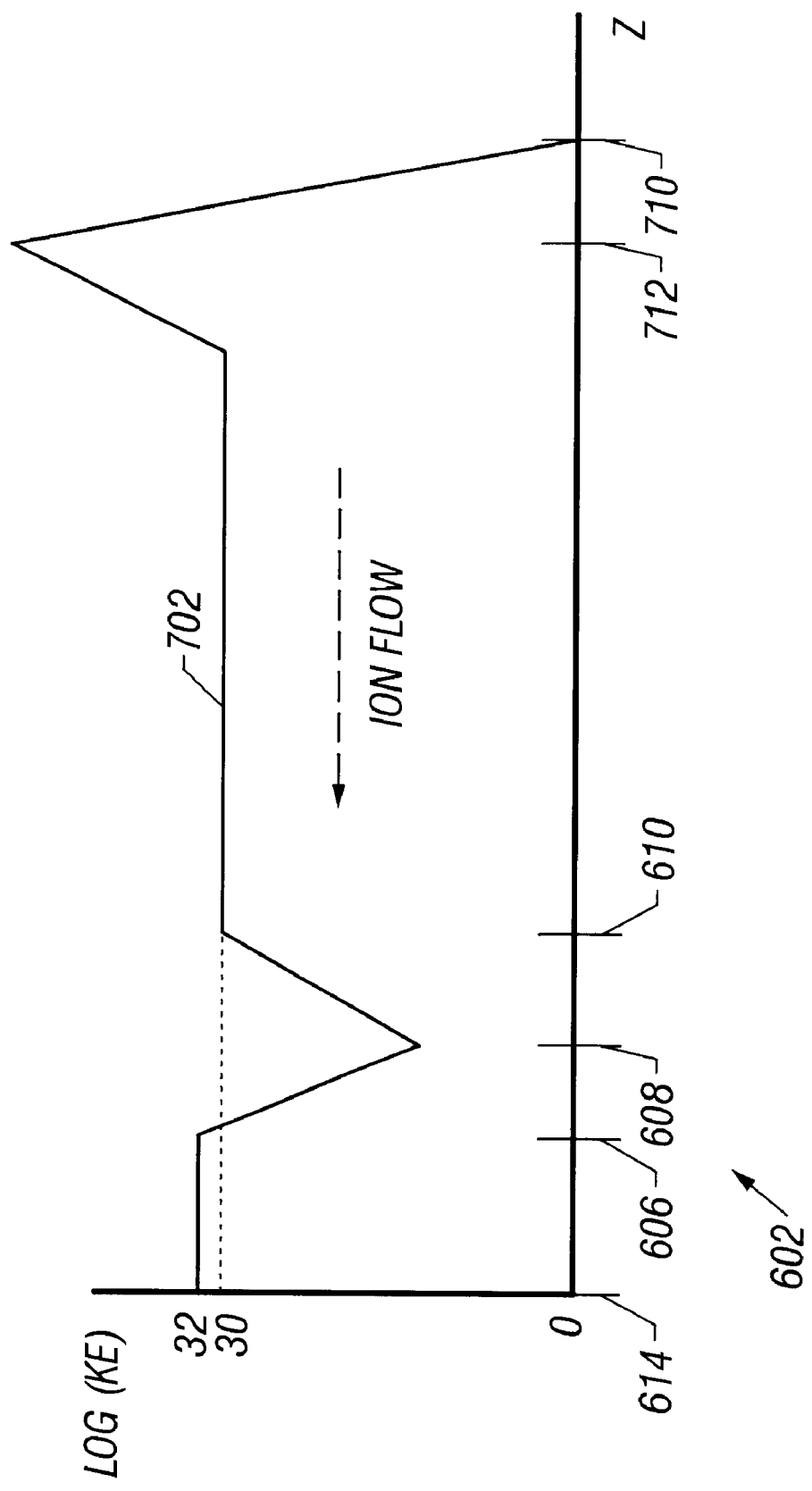
FIGS. 7A shows the kinetic energy of primary ions as they travel from an ion source to a sample through the system of FIG. 6.
Figure 7B:
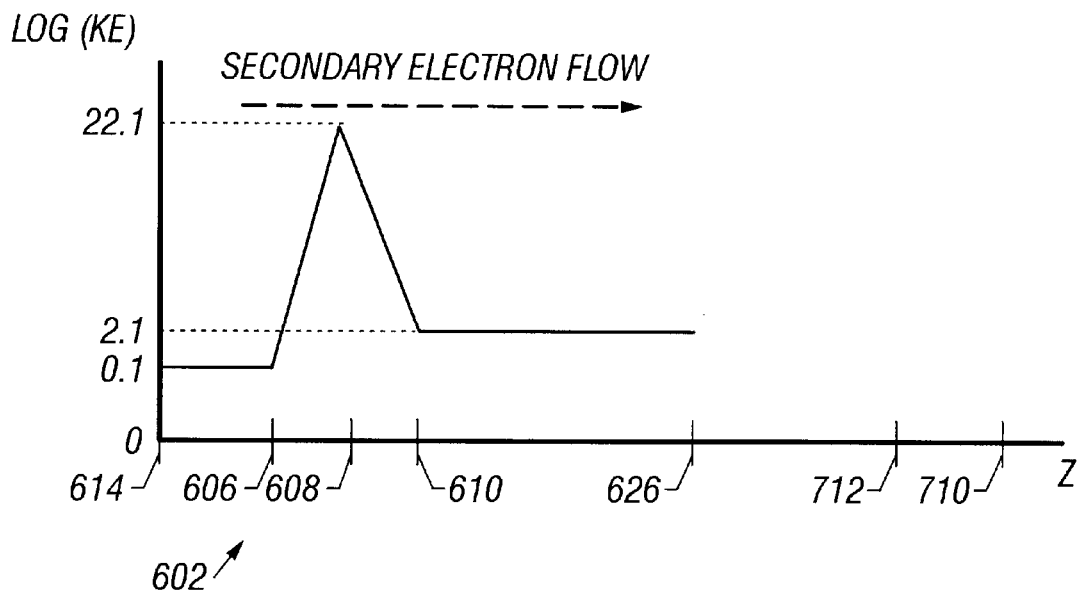
FIG. 7B shows the kinetic energy of 100 electron volts (eV) secondary electrons emitted from the sample as they travel to the magnetic deflector of the system of FIG. 6.
Figure 7C:
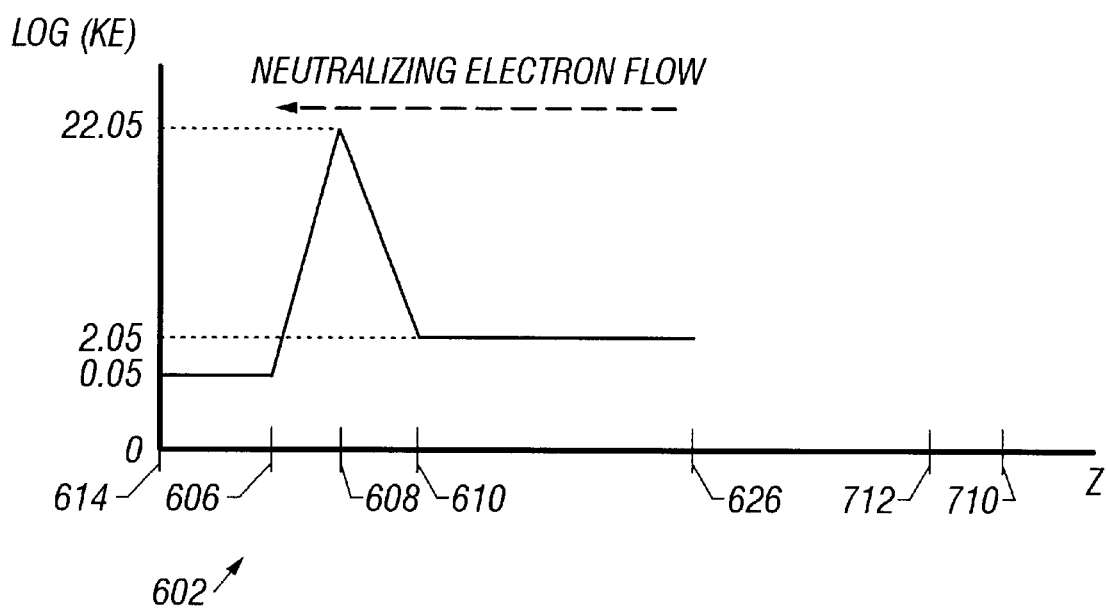
FIG. 7C shows the kinetic energy of neutralizing electrons as they travel from the flood gun to the sample through the system of FIG. 6.

FIGS. 7A–7C show the kinetic energies of ions and electrons as they traverse the system of FIG. 6. The positions of the ions or electrons are shown on the horizontal axes and the their kinetic energies (non-linear scales) are shown on the vertical axes. FIG. 7A shows a graph 702 of the kinetic energies of ions in the primary ion beam as they are emitted from a source 710 and pass towards the sample 614 through a first lens 712 and then through the system of FIG. 6, including lens elements 610, 608, and 606 of final lens 602.

Source 710 may comprise any ion source, such as a liquid metal ion source, preferably a gallium liquid metal ion source, or a plasma ion source. Details of source 710 and first lens 712 are known and are not shown. After leaving source 710, primary ions are accelerated by first lens 712 to a kinetic energy of approximately 30,000 eV. The ions decelerate as they approach middle lens element 608 of second lens 602, which is at a potential of +20,000 V, and then accelerate again to energies of 32,000 eV as they approach lens element 606, which is at a potential of −2,000 V. The ions continue with a kinetic energy of 32,000 eV toward sample 614, which is at the same potential as lens element 614. Thus, there is a great deal of energy available to be transferred to sputter material and eject ion beam generated-secondary electrons 652 from the sample.

FIG. 7B shows the kinetic energies of 100 eV secondary electrons that are ejected by impact of the primary ion beam with sample 614. These ion-beam-generated secondary electrons 652 are accelerated back through lens 602 toward electron detector 640. As was shown in FIG. 5, the primary ions generate secondary electrons having a range of kinetic energies; the 100 eV electrons shown in FIG. 7B are representative of the ion-beam-generated secondary electrons 652. The 100 eV electrons are accelerated by lens element 608 to 22,100 eV and then decelerated again by lens element 610 to 2,100 eV.

FIG. 7C shows the kinetic energy of electrons 628 emitted from the flood gun 630 and moving toward sample 614, the neutralizing electrons 628 having an initial kinetic energy of 2050 eV. Electrons from the flood gun are accelerated by lens element 608 to 22,050 eV and then decelerated by lens element 606 to 50 eV, at which energy they impact sample 614. Electrons 628 from flood gun 630 give rise to flood-gun-generated secondary electrons 654 having the same range of energies shown in distribution 502 of FIG. 5, but because the flood-gun electrons 628 cannot impart more energy than they possess when they reach the target, the maximum of energy of neutralizing-electron-generated secondary electrons 654 is 50 eV. The kinetic energy of the 50 eV flood-gun-generated secondary electrons as they return through the lens column will be the same at each position as the energy of the 2050 eV incoming neutralizing electrons. FIG. 7C thus illustrates both the kinetic energies of incoming neutralizing electrons 628 and the kinetic energy of the most energetic neutralizing-electron-generated secondary electrons 654 returning up the ion column 624.

The primary ion beam, having a kinetic energy of 32,000 eV at the sample, can give rise to more energetic secondary electrons, such as the 100 eV secondary electrons whose kinetic energy is charted in FIG. 7B. From FIGS. 7B and 7C, it can be seen that the 50 eV neutralizing-electron-generated secondary electrons will pass through a deflection magnet 626 with 50 eV less energy than the 100 eV ion-beam-generated secondary electrons. This difference can be used by retarding filter 650 (FIG. 6) to differentiate between the ion-beam-generated secondary electrons 652 and the neutralizing-electron-generated secondary electrons 654 and reject the lower energy neutralizing-electron-generated secondary electrons 654. Lower energy ion-beam-generated secondary electrons are also rejected and not available for detection, thereby reducing the imaging signal, but the remaining signal is sufficient for imaging and is expected to be an improvement over the prior art imaging using secondary ions.

The lower lens element 606 of lens 602 in FIG. 6 can be biased somewhat negatively with respect to the target to attract low energy (a few tens of eVs) secondary electrons back towards the sample to improve neutralization. Since there can be some electric field penetration towards the sample from the high positive voltage on the middle lens element 608 of lens 602, this negative bias of the lower lens element 606 with respect to the sample might need to be a hundred volts or so. Skilled persons can readily determine an appropriate bias by adjusting the potential on lens 606 until sample 614 is at the desired potential, for example, ground, as determined by the secondary electron image or other means.

Lens 602, which focuses the primary ion beam to a point on the sample surface, will also affect the size of the beam of electrons from the flood gun. The effect of lens 602 on the neutralizing electrons must be considered in the system design to ensure that the neutralizing electron beam is not so dispersed that it cannot effectively neutralize the small sample area charged by the tightly focused primary ion beam. Because the ions in the primary beam are typically positively charged and electrons are negatively charged, the middle lens element 608 of lens 602 functions as a deceleration lens to the primary ions and as an acceleration lens to the neutralizing electrons.

It is known that, for a given voltage, an acceleration lens focuses more weakly than a deceleration lens. For focusing the neutralizing electrons to a point at the sample surface, the neutralizing electrons need to be at about one fourth the energy of the primary ions. If the column is designed so that the neutralizing electron beam has a crossover in the final lens, preferably near the center element, then a lower neutralizing electron voltage can be used and the neutralizing electron beam will still focus onto the sample. The crossover may increase the aberration in the beam of neutralizing electrons, but the neutralizing electrons do not need to be fully focused to effectively neutralize charge buildup on the sample surface.

Figure 8A:
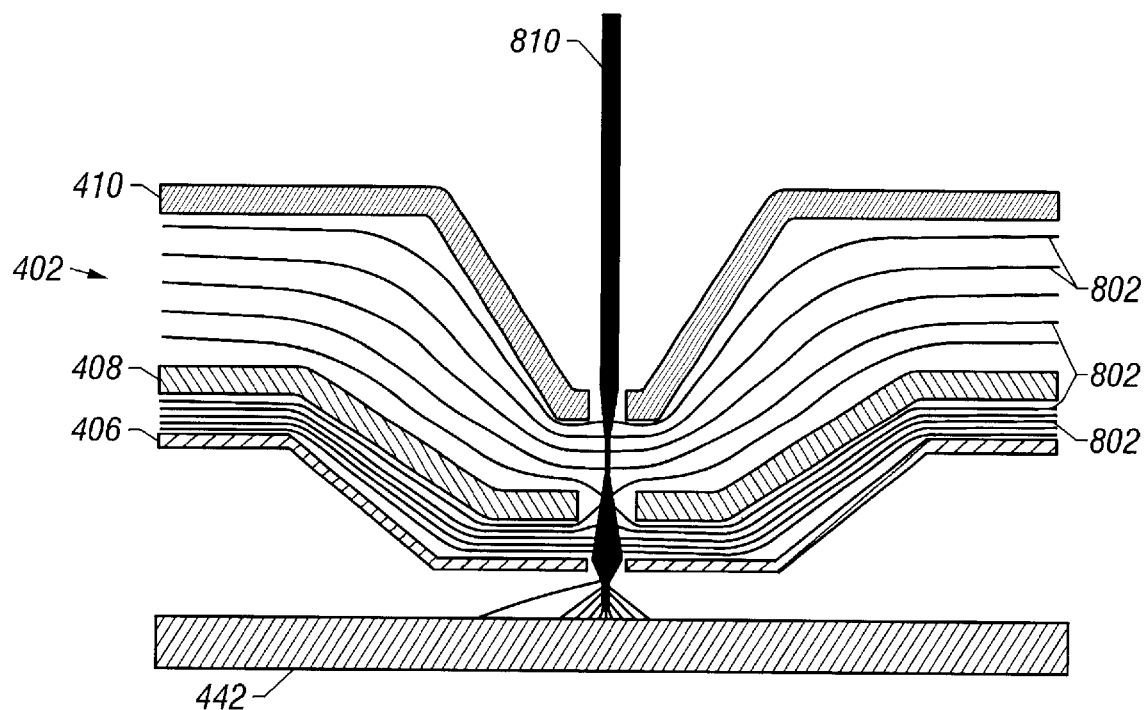
FIG. 8A shows calculated trajectories for neutralizing electrons having kinetic energies of 2.3 keV while passing above the upper lens element and kinetic energies of 300 eV at the sample.
Figure 8B:
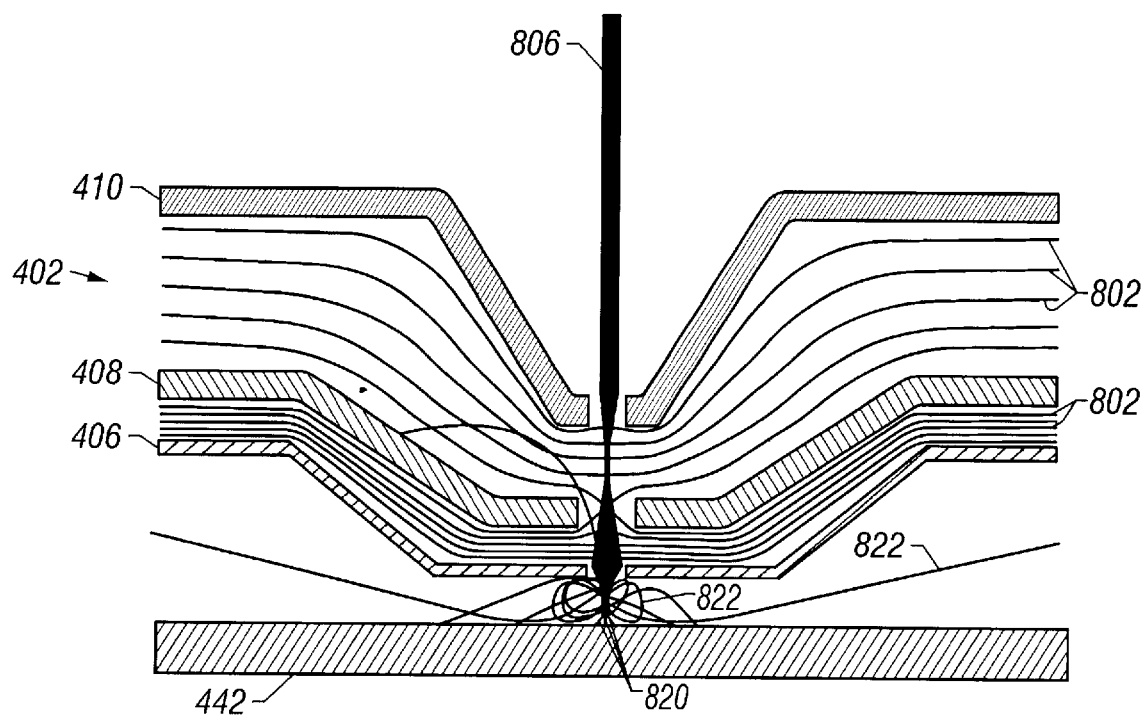
FIG. 8B shows calculated trajectories for neutralizing electrons having kinetic energies of 2.1 keV while passing above the upper lens element and kinetic energies of 100 eV at the sample.

FIGS. 8A and 8B show neutralizing electron beam trajectory simulations in the system of FIG. 4 as calculated using the SIMION program available from Scientific Instrument Services, Ringoes, N.J. FIGS. 8A and 8B also has lines 802 of equal electrical potential. FIG. 8A shows a 2.3 kV collimated neutralizing electron beam 810 originating from the +2000 V potential region above the top of FIG. 8A, passing through lens 402, and illuminating the sample. As described with respect to FIG. 4, upper lens element 410 is at an electrical potential of +2,000 V; middle lens element 408 is at an electrical potential of +22,000 volts; and lower lens element 406 and sample 442 are at ground potential. The final energy of the neutralizing electrons at the sample is 300 eV. These neutralizing electron trajectories cross over twice inside the lens before focusing at the sample, since the lens focusing effect is stronger to these low energy electrons than to the primary ion beam.

FIG. 8B shows a 2.1 kV collimated neutralizing electron beam 806 originating from the top of the FIG., passing through lens 602, and focusing at the sample. The neutralizing electrons have energies of 100 eV at the sample. Under these conditions, neutralizing electrons having trajectories 820 that are nearly normal to the sample will easily arrive at the sample, whereas neutralizing electrons having trajectories 822 that make a significant angle with the normal are reflected upward by the sample potential. (The magnitudes of the velocities of all the neutralizing electrons are about the same, regardless of the incoming angle, but the electrons arriving at a non-zero angle have a velocity component perpendicular to the optical axis so the velocity along the optical axis is reduced. The retarding field in the direction of the optical axis causes large angle electrons to be deflected and change direction before reaching the sample.)

If the sample has a positive charge as described above, many of these electrons will be drawn to the sample to neutralize that charge. If the neutralizing electrons have small angles with respect to the lens axis and the sample normal, then the sample surface will be maintained close to −100 V potential. Thus, the charge on the sample can be controlled by controlling the kinetic energy of the neutralizing electrons. Further optimizations of the flood gun trajectories onto the sample can be made by changing the potential of the upper lens element and, correspondingly, the kinetic energies of the neutralizing electrons in the region above the upper lens element, to better focus the neutralizing electrons onto the sample.

Trajectories were calculated for secondary electrons emitted from the sample at between 0 and 170 degrees full angle spread (0 to 85 degrees half angle) with respect to the lens axis or sample normal. The secondary electrons have 5 eV initial energy as they leave the sample and kinetic energies of 2.005 keV as they accelerated from the sample up through the final lens. The 5 eV secondary electrons are somewhat collimated by the column final lens 402 for deflection and detection by the through-the-lens side-mounted detector. Further optimization of the upper lens element potential and lens configuration should improve the secondary electron collection efficiency. The angular detection efficiency decreases as the secondary electron energy increases.

If the sample is neutralized, for example, by 100 eV neutralizing electrons directed onto the sample and the electron detector or filter rejects secondary electrons below 120 eV energy, the energy detection for 120 eV secondary electrons will be lower than for 5 eV electrons. The energy will still be sufficiently high to provide adequate signal detection for many applications and is expected to achieve better signal-to-noise ratio than prior art secondary ion detection used with electron beam charge neutralization.

An alternate detection method suitable for detecting secondary electrons is to place an isolated plate, such as an annular ring, inside the vacuum chamber directly below the final lens lower element and to place a high frequency, low noise amplifier close to the isolated detector plate. In addition, a retarding grid is placed below the detector plate to eliminate flood gun generated electrons. The current of secondary electrons arriving at the plate is detected and amplified by the amplifier to produce an output signal corresponding to the number of secondary electrons. This method is particularly applicable for situations in which the secondary electron current is sufficiently large to be readily detected.

It is sometimes desirable to allow a sample to accumulate a controlled amount of charge, for example, for voltage contrast imaging. In the present invention, the electron source current and voltage can be controlled to allow a controlled amount of charge to accumulate on the sample. As described above, the energy of the incoming neutralizing electrons can be controlled so that they only reach the sample if it exceeds a specified potential, typically but not necessarily ground, thereby automatically maintaining a specified charge on the sample. The term "neutralization" as used herein means that some, but not necessarily all, of the sample charge is neutralized. In some embodiments, the sample charge can be neutralized as it is created, so excess charge may not actually accumulate.

The present invention can be implemented in an electron beam system, as well as the ion beam system described above.

Although the present invention and its advantages have been described in detail, it should be understood that various changes, substitutions and alterations can be made to the embodiments herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. An apparatus for neutralizing electrical charge on a sample in a focused ion beam system, comprising:
   a source of neutralizing electrons positioned away from the optical axis;
   an ion optical column having an optical axis and including a final lens; and
   a deflector for deflecting the neutralizing electrons onto the optical axis and through the final lens to neutralize electrical charge on the sample.

2. The apparatus of claim 1 further comprising a deflector to deflect neutralizing electrons to travel substantially parallel to the optical axis toward the sample.

3. The apparatus of claim 2 in which the deflector uses a magnetic field to deflect the neutralizing electrons.

4. The apparatus of claim 1 further comprising an electron detector for detecting secondary electrons emitted from the sample.

5. The apparatus in claim 4 wherein the electron detector is positioned between the final lens and the sample.

6. The apparatus of claim 5 comprises a scintillator, channel electron multiplier, microchannel plate or collector plate.

7. The apparatus of claim 4 in which the electron detector detects electrons collected through the final lens.

8. The apparatus of claim 7 further comprising a deflector to deflect neutralizing electrons to travel substantially parallel to the optical axis and to deflect away from the optical axis secondary electrons collected through the final lens.

9. The apparatus of claim 7 further comprising an energy filter positioned between the sample and the electron detector, the energy filter discriminating between secondary electrons generated by the ion beam impacting the sample and secondary electrons generated by neutralizing electrons impacting the sample so that the electron detector detects primarily secondary electrons generated by the ion beam impacting the sample.

10. The apparatus in claim 1 wherein the ion optical column includes elements that are electrically biased so as to cause secondary electrons emitted from the sample to travel from the sample through the final lens.

11. The apparatus in claim 10 wherein the elements include a final lens upper element, deflection and steering assemblies, and a flood gun and in which the final lens upper element, deflection and steering assemblies, and flood gun are maintained at electrical potentials of less than 500V and the sample is biased to between 500 V and 5000V.

12. The apparatus of claim 10 wherein the elements include a final lens upper element, deflection and steering assemblies and wherein the final lens upper lens element, deflection and steering assemblies, and flood gun are biased to potentials of between 500 V and 5000V and the sample is maintained at a potential of less than 500 V.

13. The apparatus in claim 1 where the sample is either perpendicular to or tilted with respect to the optical axis.

14. The apparatus in claim 1 where the deflector is a magnet or Wien filter.

15. A method of neutralizing charge on a sample in a charged particle beam system comprising passing charged particles through the final lens of the charged particle beam system to neutralize charges on the sample.

16. The method of claim 15 further comprising collecting secondary particles for detection through the final lens of the charged particle beam system.

17. The method of claim 16 in which passing charged particles through the final lens of the charged particle beam system to neutralize charges on the sample includes:

providing electrons; and passing the electrons through the final lens of a focused ion beam system to neutralize charges on the sample.

18. The method of claim 17 in which the focused ion beam system includes an optical axis and in which passing electrons through the final lens of a focused ion beam system includes directing the electrons from a source off of the optical axis into a direction parallel to the optical axis.

19. The method of claim 17 further comprising deflecting the secondary electrons away from the optical axis for detection and deflecting neutralizing electrons into a direction parallel to the optical axis.

20. The method of claim 16 further comprising passing secondary electrons through a filter to separate secondary electrons produced by the focused ion beam.

21. The method of claim 15 in which the charged particle beam system includes a primary beam column and further comprising electrically biasing elements in the primary beam column optical column to cause secondary electrons ejected from the sample to travel through the final lens.

22. The method of claim 16 further comprising trimming magnetic heads, cutting integrate circuit fuses, or perform other nanofabrication using the focused ion beam.

* * * * *